(12) United States Patent
Wang et al.

(10) Patent No.: US 7,099,192 B2
(45) Date of Patent: Aug. 29, 2006

(54) NONVOLATILE FLASH MEMORY AND METHOD OF OPERATING THE SAME

(75) Inventors: Lee Zhung Wang, Chu-Pei (TW); Daniel Huang, Chu-Pei (TW); Hsin Chang Lin, Chu-Pei (TW); Roget Chang, Chu-Pei (TW)

(73) Assignee: Yield Microelectronics Corp., Hsinchu (TW)

( * ) Notice: Subject to any disclaimer, the term of this patent is extended or adjusted under 35 U.S.C. 154(b) by 0 days.

(21) Appl. No.: 10/861,392

(22) Filed: Jun. 7, 2004

(65) Prior Publication Data

US 2005/0270850 A1    Dec. 8, 2005

(51) Int. Cl.
*G11C 16/04* (2006.01)

(52) U.S. Cl. .............................. 365/185.1; 365/185.28; 365/185.29; 365/185.33; 257/316; 257/318

(58) Field of Classification Search ............. 365/185.1, 365/185.28, 185.29; 257/316, 318
See application file for complete search history.

(56) References Cited

U.S. PATENT DOCUMENTS

| | | | | |
|---|---|---|---|---|
| 5,465,231 A | * | 11/1995 | Ohsaki ................... | 365/185.33 |
| 5,719,427 A | * | 2/1998 | Tong et al. ................... | 257/355 |
| 6,044,018 A | * | 3/2000 | Sung et al. ............. | 365/185.18 |
| 6,100,560 A | * | 8/2000 | Lovett ......................... | 257/315 |
| 6,222,764 B1 | * | 4/2001 | Kelley et al. ........... | 365/185.07 |
| 6,324,097 B1 | * | 11/2001 | Chen et al. .............. | 365/185.1 |
| 6,512,700 B1 | * | 1/2003 | McPartland et al. ... | 365/185.28 |
| 6,528,839 B1 | * | 3/2003 | Shukuri et al. .............. | 257/314 |
| 6,545,311 B1 | * | 4/2003 | Shukuri et al. .............. | 257/314 |
| 6,731,541 B1 | * | 5/2004 | Kinsey et al. ......... | 365/185.18 |

* cited by examiner

*Primary Examiner*—Son Mai
(74) *Attorney, Agent, or Firm*—Rosenberg, Klein & Lee

(57) ABSTRACT

A nonvolatile memory and a method of operating the same are proposed. The nonvolatile memory has single-gate memory cells, wherein a structure of a transistor and a capacitor is embedded in a semiconductor substrate. The transistor comprises a first conducting gate stacked on the surface of a dielectric with doped regions formed at two sides thereof as a source and a drain. The capacitor comprises a doped region, a dielectric stacked thereon, and a second conducting gate. The conducting gates of the capacitor and the transistor are electrically connected together to form a single floating gate of the memory cell. The semiconductor substrate is p-type or n-type. Besides, a back-bias program write-in and related erase and readout operation ways are proposed for the single-gate memory cells.

9 Claims, 11 Drawing Sheets

NONVOLATILE FLASH MEMORY AND METHOD OF OPERATING THE SAME

FIELD OF THE INVENTION

The present invention relates to the structure of a nonvolatile memory and, more particularly, to the structure of a flash memory with an ultra-low program current and a high-homogeneity erase architecture and a method of operating the same.

BACKGROUND OF THE INVENTION

The complementary metal oxide semiconductor (CMOS) fabrication technology has become a common fabrication method of application specific integrated circuits (ASIC). Today, electrically erasable programmable read only memories (EEPROM) have been widely used in electronic products because of their non-volatile functions of electrically writing and erasing data.

Nonvolatile memory cells are programmable. Electric charges are stored to change the gate voltages of memory cell transistors, or electric charges are not stored to keep the original gate voltages of memory cell transistors. The erase operation removes all electric charges stored in nonvolatile memory cells to let all nonvolatile memory cells restore to the original gate voltages of memory cell transistors. Therefore, in the structure of a conventional nonvolatile memory cell, an extra conducting layer is added to store electric charges in addition to the gate layer of the transistor, hence forming a double-layer structure. As compared to the common CMOS fabrication process, there are more steps of film deposition, etch, and photolithography, hence increasing the cost, complicating the process, lowering the yield and lengthening the fabrication time.

A single-gate EEPROM structure has thus been proposed. This structure, however, has the problems of low reliability, interference from non-selected memory cells during the program step, and over erase. FIG. 1 shows a conventional EEPROM memory cell structure. N-type doped regions as a source 12 and a drain 14 are formed in a p-type semiconductor substrate 10. A channel is formed between the source 12 and the drain 14. A silicon dioxide 16, a catch layer (e.g., silicon nitride) 18, and an oxide 20 are formed in order on the surface of the substrate. A control gate 22 is disposed on the surface of the oxide 20. When a program/erase/write operation is performed to this memory cell, it is necessary to provide a large enough voltage for the drain and the source to finish the above action through a channel formed by this high voltage difference. Therefore, for the conventional single-gate EEPROM, the whole operation current can't be reduced easily. The operation current will be slightly high. Moreover, because the memory cell array becomes denser and denser, the channel length shortens accordingly, hence causing mutual interference between memory cells. Furthermore, a complicated peripheral circuit design is required for a higher operation current. Therefore, the above high-voltage operation method will increase the complexity of the peripheral circuit.

Besides, in the erase method of the conventional EEPROM, stored electric charges will move from the floating gate to the transistor to be removed due to the Fowler-Nordheim tunneling (F-N tunneling) effect. Because the structure of a single-gate EEPROM memory cell is a sandwich structure of transistor substrate-floating gate-capacitor substrate, stored electric charges can be released to either direction according to the direction of the applied electric field, hence more deteriorating the problem of over erase of the single-gate EEPROM.

Accordingly, the present invention aims to propose a modified structure of a nonvolatile memory cell and a method of operating the same to effectively solve the above problems in the prior art and also shrinking the memory cell.

SUMMARY OF THE INVENTION

An object of the present invention is to provide a nonvolatile memory cell structure and a method of operating the same, wherein a single floating gate is used. When performing a program step, a nontrivial voltage is applied to the source or a back bias is applied to the transistor substrate to form a wider and depleted source/substrate junction, thereby improving the efficiency of current flowing to the floating gate and thus greatly reducing the current requirement of performing a program step to a single gate EEPROM.

Another object of the present invention is to provide a method of operating a nonvolatile memory cell. Through enhancing the source-drain voltage, the F-N tunneling current is regulated to perform an erase action to accomplish the effect of high-homogeneity erase.

Another object of the present invention is to provide a nonvolatile memory cell to accomplish the effects of a low operation current, high reliability and also miniaturize the size of the whole memory chip.

According to the present invention, a single-gate EEPROM memory cell comprises a MOFET and a capacitor structure. The MOSFET comprises a conducting gate stacked on the surface of a dielectric film. The dielectric layer is located on a semiconductor substrate. Two highly conductive doped regions are located at two sides of the conducting gate to form a source and a drain. The capacitor structure, the same as the transistor, is a sandwich structure of plate-dielectric layer-plate. The plate of the capacitor structure and the gate of the MOSFET are electrically connected together. The plate of the capacitor structure and the gate of the MOSFET form a single floating gate of the EEPROM memory cell. The semiconductor substrate is p-type, while the doped regions are an n-well; or the semiconductor substrate is n-type, while the doped regions are a p-well.

The method of operating the single-gate EEPROM comprises the program step of applying a nontrivial voltage to the source or a back-bias to the substrate of the MOSFET and the erase step of raising the source-drain voltage to regulate the F-N tunneling current. All operations of performing the program and erase steps to EEPROM of different structures are embraced within the scope of the invention.

The various objects and advantages of the present invention will be more readily understood from the following detailed description when read in conjunction with the appended drawings, in which:

DETAILED DESCRIPTION OF THE PREFERRED EMBODIMENTS

Figure 1:
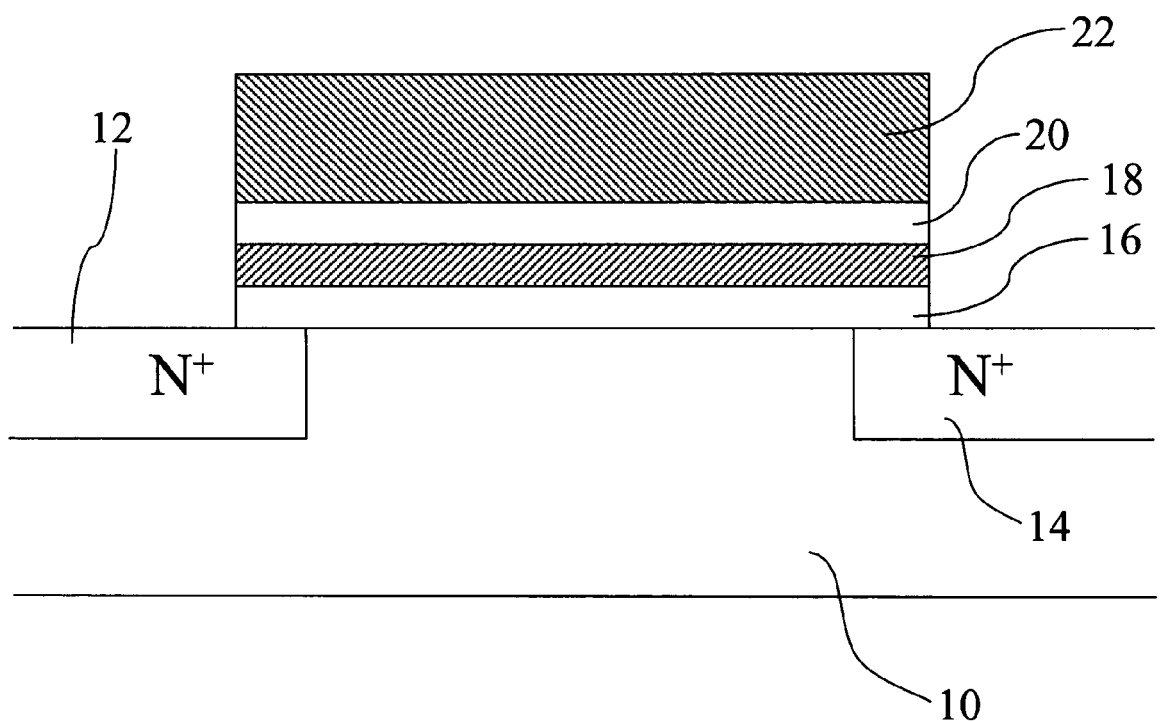
FIG. 1 is a structure diagram of a conventional EEPROM memory cell.
Figure 2:
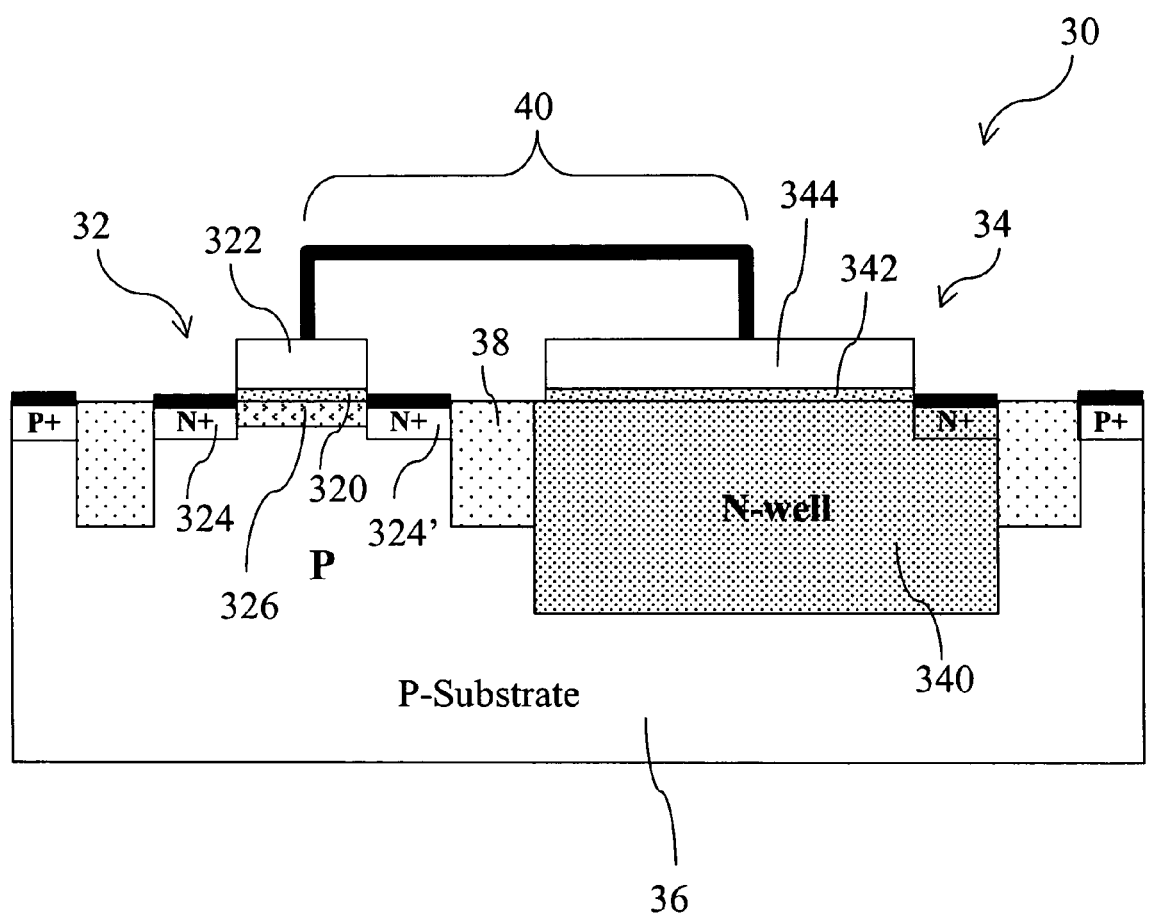
FIG. 2 is a cross-sectional view of the structure of a single-gate EEPROM memory cell according to a first embodiment of the present invention.

As shown in FIG. 2, a single-gate EEPROM memory cell 30 comprises an NMOS transistor (NMOSFET) 32 and an N-well capacitor 34 in a p-type silicon substrate 36. The NMOSFET 32 comprises a first dielectric 320 on the surface of the p-type silicon substrate 36, a first conducting gate 322 stacked above the first dielectric 320 and two n$^+$ doped regions in the p-type silicon substrate 36 as a source 324 and a drain 324'. A channel 326 is formed between the source 324 and the drain 324'. The N-well capacitor 34 comprises a doped region in the p-type silicon substrate 36 (i.e., an N-well 340), a second dielectric 342 on the surface of the N-well 340, and a second conducting gate 344 stacked above the second dielectric 342 to form a sandwich capacitor structure of top plate-dielectric-bottom plate. The conducting gate 322 of the NMOSFET 32 and the conducting gate 344 of the N-well capacitor 34 are electrically connected together and isolated by an isolator 38 to form the structure of a single floating gate 40.

Figure 3A:
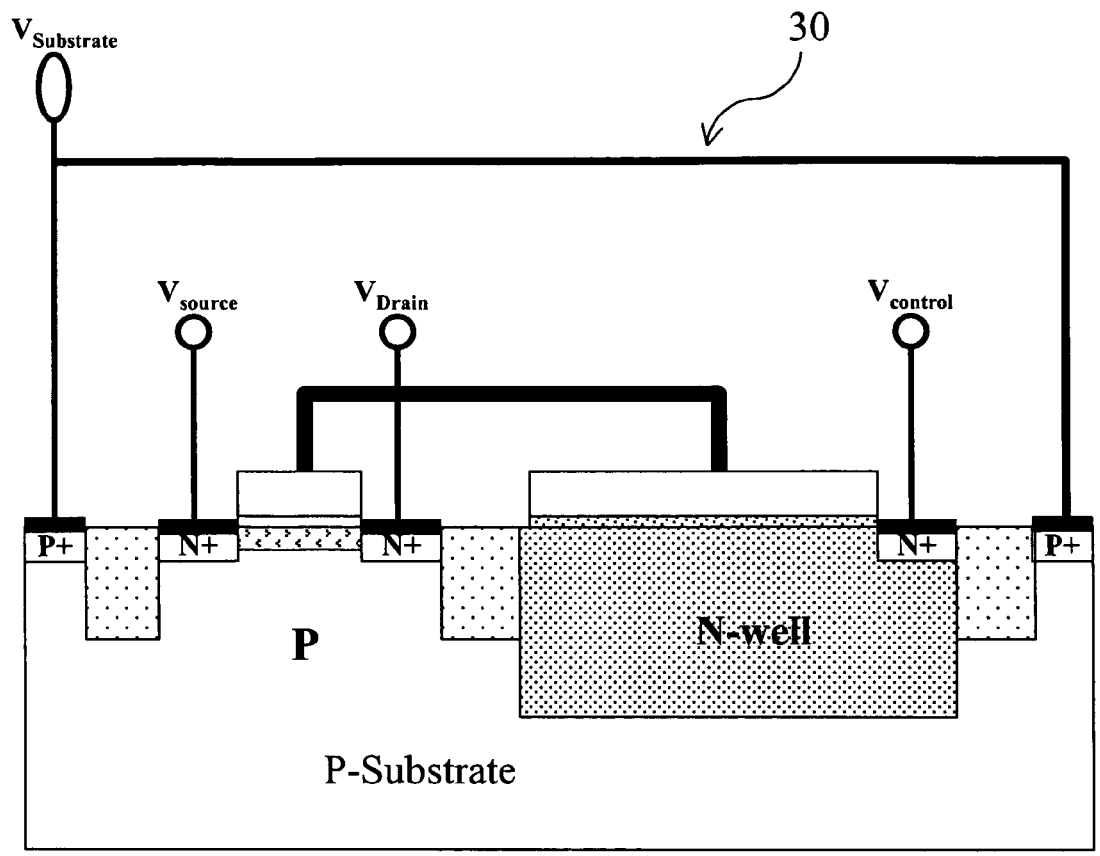
FIG. 3(a) is a structure diagram with four terminals disposed in the first embodiment of FIG. 2.

As shown in FIG. 3(a), the single-gate EEPROM memory cell 30 has four terminals connected to the source, the drain, the control gate and the substrate, respectively. A substrate voltage $V_{substrate}$, a source voltage $V_{source}$, a drain voltage $V_{drain}$ and a control gate voltage $V_{control}$ are applied on the substrate, the source, the drain and the first doped region, respectively. An ultra-low-current program condition of the single-gate EEPROM memory cell 30 is as follows:

(1) a nontrivial source voltage program:
   a. Let The substrate voltage $V_{substrate}$ be ground (=0); and
   b. Let $V_{source} > V_{substrate} = 0$ (a back-bias is formed at the source-substrate junction) and let $V_{source} < V_{drain}$ (A drain current is produced);

Therefore, $V_{control} > V_{drain} > V_{source} > V_{substrate} = 0$ (The NMOSFET is turned on to produce a gate current).

Or (2) a substrate back-bias program:
   a. Let the substrate voltage $V_{substrate}$ be nonzero but close to zero; and
   b. Let $V_{source} > V_{substrate}$ (a back-bias is formed at the source-substrate junction) and let $V_{source} < V_{drain}$ (A drain current is produced).

Therefore, $V_{control} > V_{drain} > V_{source} > V_{substrate}$ (The NMOSFET is turned on to produce a gate current).

Figure 4:
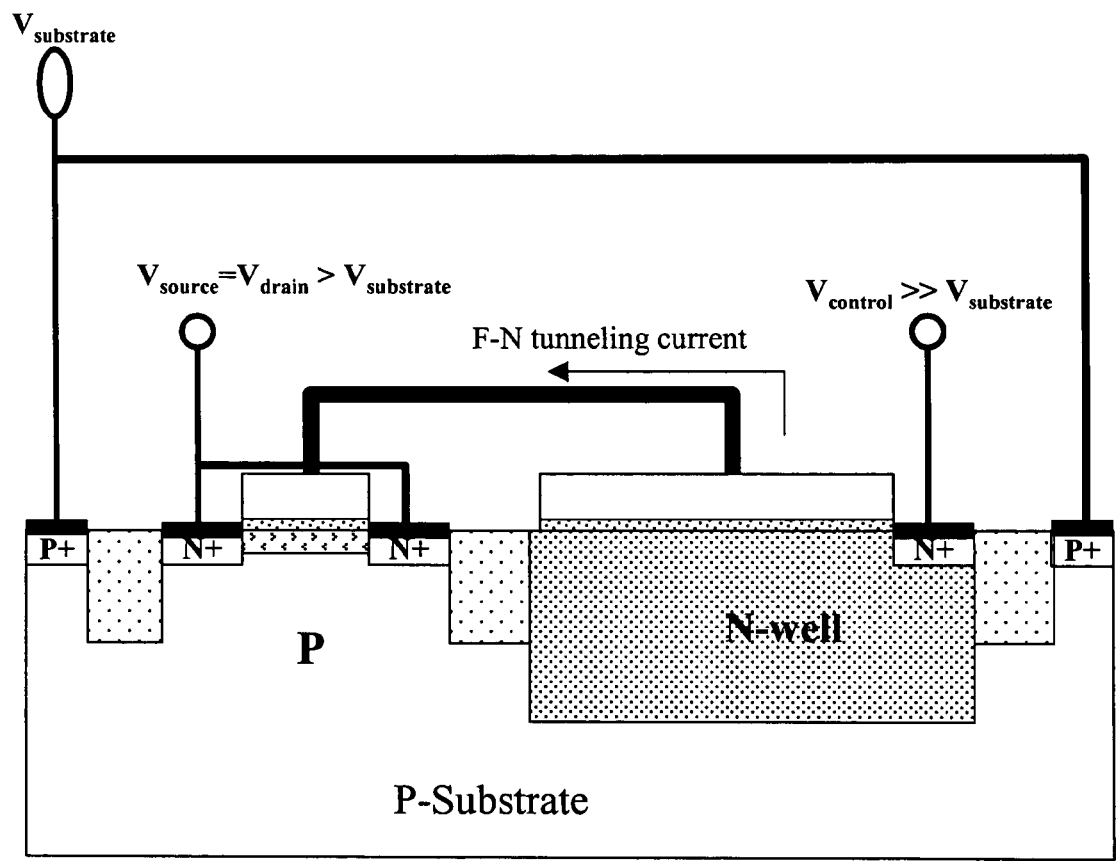
FIG. 4 shows an erase architecture of the first embodiment of FIG. 2.

FIG. 4 shows the erase architecture of the embodiment in FIG. 2. The erase architecture has a high homogeneity. The control gate voltage $V_{control}$ should be highly positive to cause the F-T tunneling from the floating gate to control gate. Electrons in the floating gate will tunnel through the control-dielectric into the control gate electrode. In contrast to the conventional erase architecture, instead of grounded or negative source and drain voltage to increase the tunneling current, a slightly positive voltage but much smaller than the applied control gate voltage $V_{control}$ is applied to both source and drain to regulate the tunneling current. The regulated current makes highly homogeneous erase architecture.

Figure 5:
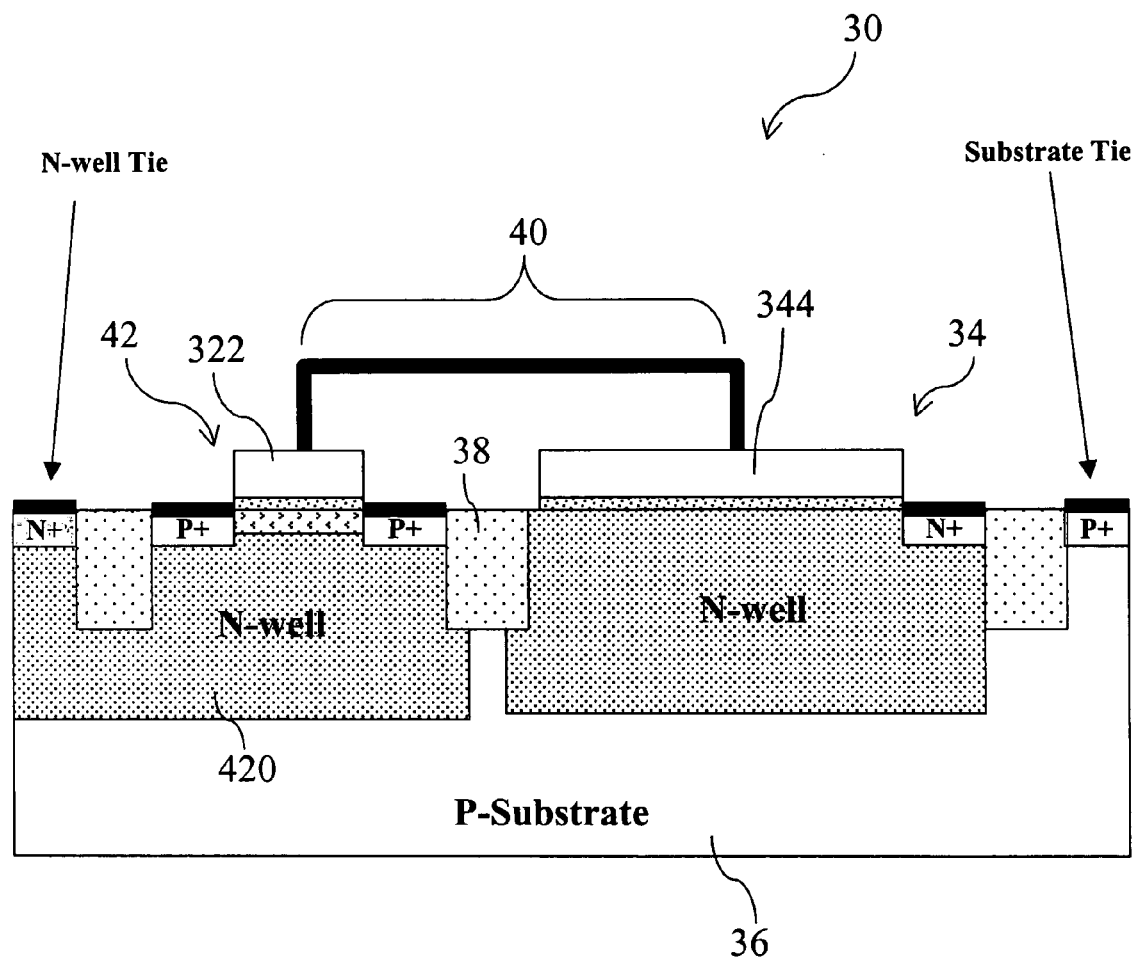
FIG. 5 is a cross-sectional view of the structure of a single-gate EEPROM memory cell according to a second embodiment of the present invention.

As shown in FIG. 5, a single-gate EEPROM memory cell 30 comprises a PMOS transistor (PMOSFET) 42 and an N-well capacitor 34 in a p-type silicon substrate 36. In addition to an extra N-well 420 in the p-type silicon substrate 36, the structure of the PMOSFET 42 is the same as that of the first embodiment and thus won't be further described. Similarly, the gate 322 of the PMOSFET 42 and the top gate 344 of the N-well capacitor 34 are electrically connected together and isolated by an isolator 38 to form the structure of a single floating gate 40.

An ultra-low-current program condition of the single-gate EEPROM memory cell 30 in FIG. 5 is as follows:

(1) a nontrivial source voltage program:
   a. Let the substrate voltage $V_{substrate}$ be ground (=0); and
   b. Let $V_{source} < V_{well}$ (a back-bias is formed at the source-N-well junction) and let $V_{source} > V_{drain}$ (A drain current is produced);

Therefore, $V_{control} < V_{drain} < V_{source} < V_{well}$ (The PMOSFET is turned on to produce a gate current), and $V_{control} > V_{substrate}$ (A back-bias is formed at the control gate/substrate N/P junction).

Or (2) a substrate back-bias program:
   a. Let the substrate voltage $V_{substrate}$ be nonzero but close to zero; and
   b. Let $V_{source} < V_{well}$ (a back-bias is formed at the source-transistor N-well junction) and let $V_{source} > V_{drain}$ (A drain current is produced).

Therefore, $V_{control} < V_{drain} < V_{source} < V_{well}$ (The PMOSFET is turned on to produce a gate current), and $V_{control} > V_{substrate}$ (A back-bias is formed at the control gate/substrate N/P junction).

Figure 6:
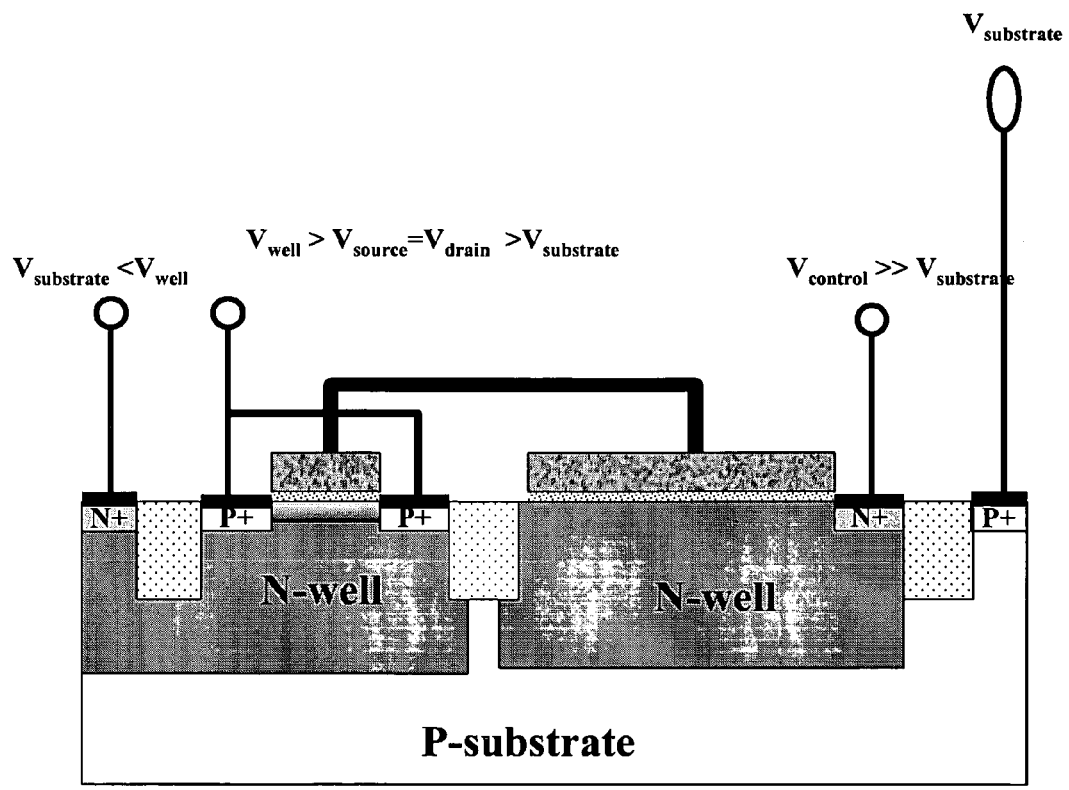
FIG. 6 shows an erase architecture of the second embodiment of FIG. 5.

FIG. 6 shows the erase architecture of the embodiment in FIG. 5. The erase architecture has a high homogeneity. The control gate (capacitive N-well) should be highly positive to cause the F-N tunneling from the floating gate to the control gate, while the transistor's source and drain shall be applied a slightly positive voltage but much smaller than the high positive control gate voltage. The slightly positive source and drain voltage is to regulate the F-T tunneling from floating gate to the control gate. It is also noted that the transistor's Nwell shall be equal or greater than the applied source and drain voltage to prevent the forward biasing from the source and drain to the transistor Nwell.

Figure 7:
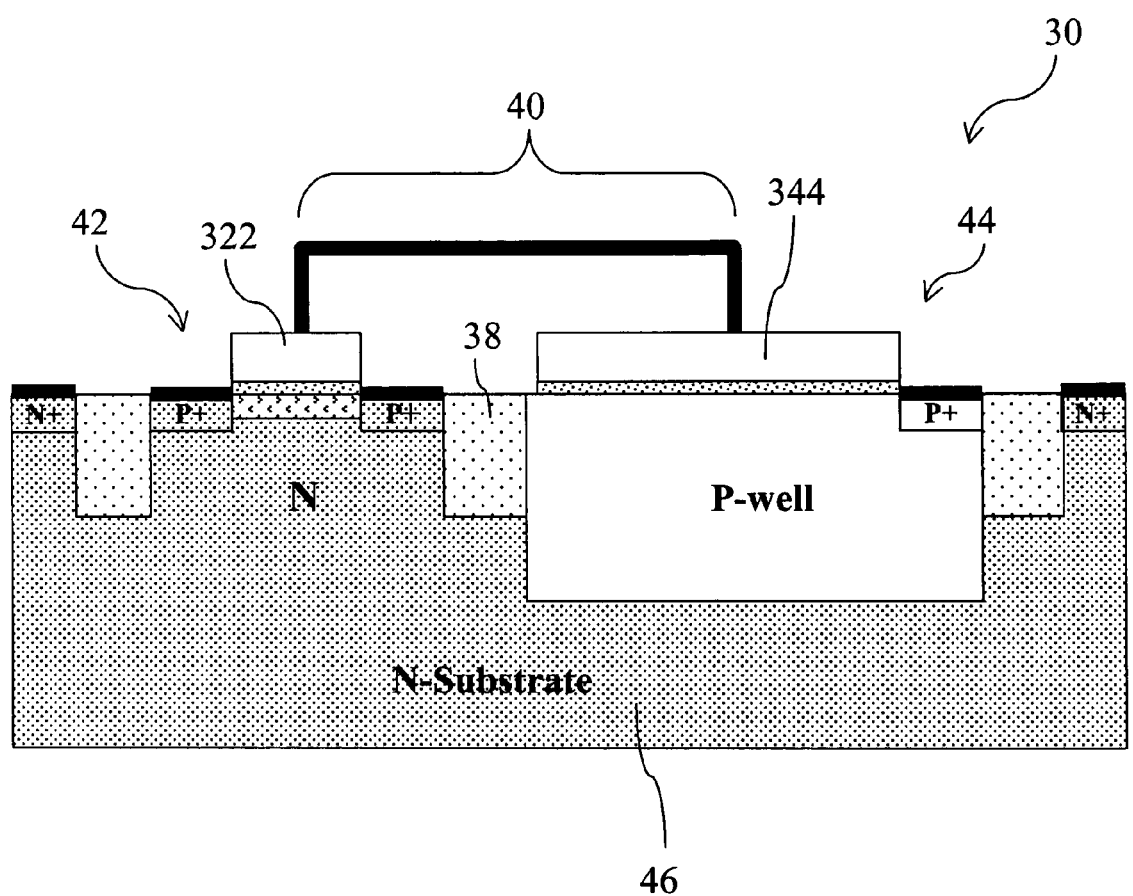
FIG. 7 is a cross-sectional view of the structure of a single-gate EEPROM memory cell according to a third embodiment of the present invention.

As shown in FIG. 7, a single-gate EEPROM memory cell 30 comprises a PMOS transistor (PMOSFET) 42 and a P-well capacitor 44 in an n-type silicon substrate 46. The gate 422 of the PMOSFET 42 and the top gate 344 of the P-well capacitor 44 are electrically connected together and isolated by an isolator 38 to form the structure of a single floating gate 40.

An ultra-low-current program condition of the single-gate EEPROM memory cell 30 in FIG. 7 is as follows:

(1) a nontrivial source voltage program:
   a. Let the substrate voltage $V_{substrate}$ be ground (=0); and
   b. Let $V_{source} < V_{substrate} = 0$ (a back-bias is formed at the source-substrate junction) and let $V_{source} > V_{drain}$ (A drain current is produced);

Therefore, $V_{control} < V_{drain} < V_{source} < V_{substrate}$ (The PMOSFET is turned on to produce a gate current).

Or (2) a substrate back-bias program:
a. Let the substrate voltage $V_{substrate}$ be nonzero but close to zero; and
b. Let $V_{source} < V_{substrate}$ (a back-bias is formed at the source-substrate junction) and let $V_{source} > V_{drain}$ (A drain current is produced).

Therefore, $V_{control} < V_{drain} < V_{source} < V_{substrate}$ (The PMOSFET is turned on to produce a gate current).

Figure 8:
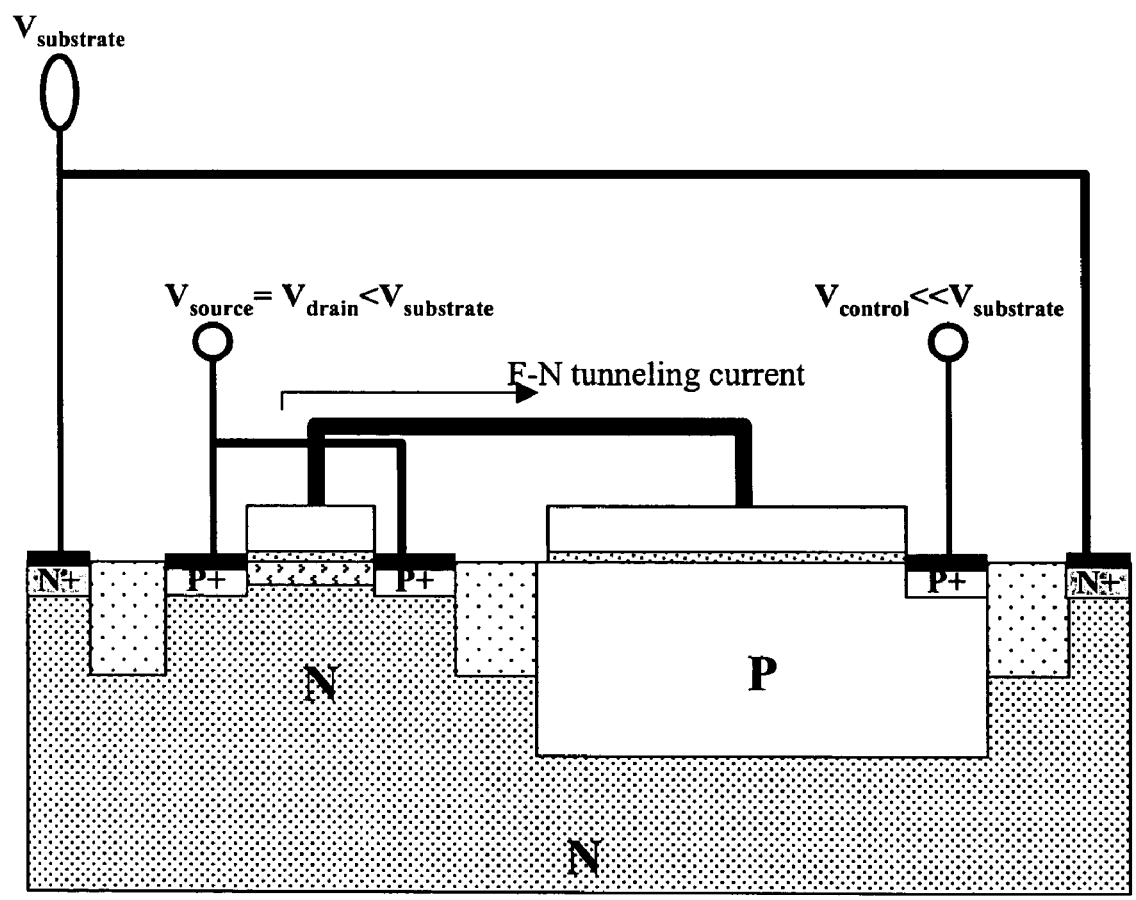
FIG. 8 shows an erase architecture of the third embodiment of FIG. 7.

FIG. 8 shows the erase architecture of the embodiment in FIG. 7. The erase architecture has a high homogeneity. The control gate voltage $V_{control}$ should be negative and much more negative than the substrate voltage $V_{substrate}$ to let cause the F-N tunneling. The strong electrical field created from the highly negative control gate voltage cause the electrons in the floating gate tunnel through the oxide into the source and drain regions. In contrast to the conventional F-T erase, instead of connecting source and drain to around or a positive voltage to enhance the F-N tunneling current, a slightly negative voltage but having magnitudes much smaller than that of the applied control gate voltage applies to both source and drain to regulate the F-N tunneling process. The regulated tunneling process makes the erase architecture a high homogeneity.

Figure 9:
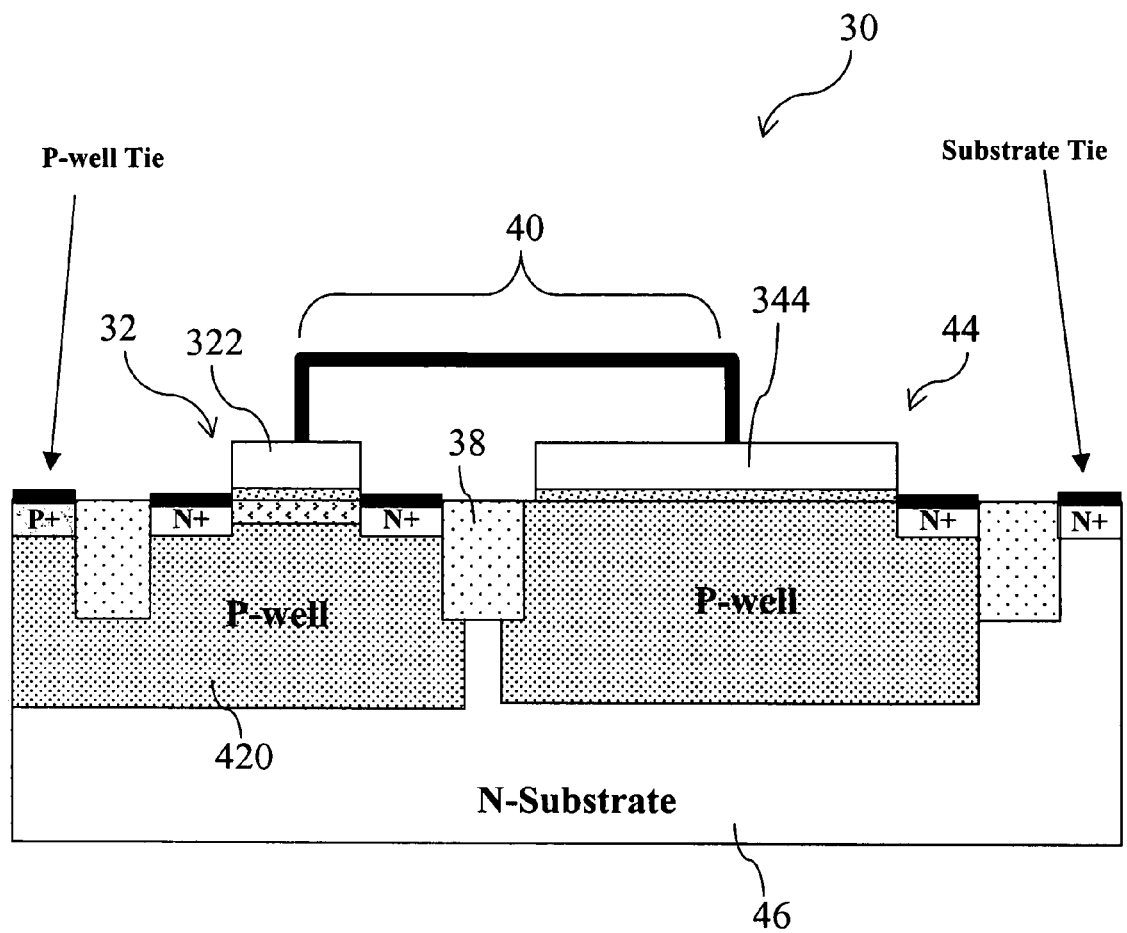
FIG. 9 is a cross-sectional view of the structure of a single-gate EEPROM memory cell according to a fourth embodiment of the present invention.

As shown in FIG. 9, a single-gate EEPROM memory cell 30 comprises an NMOS transistor (NMOSFET) 32 and a P-well capacitor 44 in an n-type silicon substrate 46. The gate 322 of the NMOSFET 42 and the top gate 344 of the P-well capacitor 44 are electrically connected together and isolated by an isolator 38 to form the structure of a single floating gate 40.

An ultra-low-current program condition of the single-gate EEPROM memory cell 30 in FIG. 9 is as follows:
(1) a nontrivial source voltage program:
a. Let the substrate voltage $V_{substrate}$ be ground (=0); and
b. Let $V_{source} > V_{well}$ (a reverse bias is formed at the source-transistor's P-well junction) and let $V_{source} < V_{drain}$ (A drain current is produced);

Therefore, $V_{control} > V_{drain} > V_{source} > V_{well}$ (The NMOSFET is turned on to produce a gate current), and $V_{control} < V_{substrate}$ (A reverse bias is formed at the control gate/substrate's N/P junction).

Or (2) a substrate back-bias program:
a. Let the substrate voltage $V_{substrate}$ be nonzero but close to zero; and
b. Let $V_{source} > V_{well}$ (a reverse bias is formed at the source-transistor's P-well junction) and let $V_{source} < V_{drain}$ (A drain current is produced).

Therefore, $V_{control} > V_{drain} > V_{source} > V_{well}$ (The NMOSFET is turned on to produce a gate current), and $V_{control} < V_{substrate}$ (A reverse bias is formed at the control gate/substrate's N/P junction).

Figure 10:
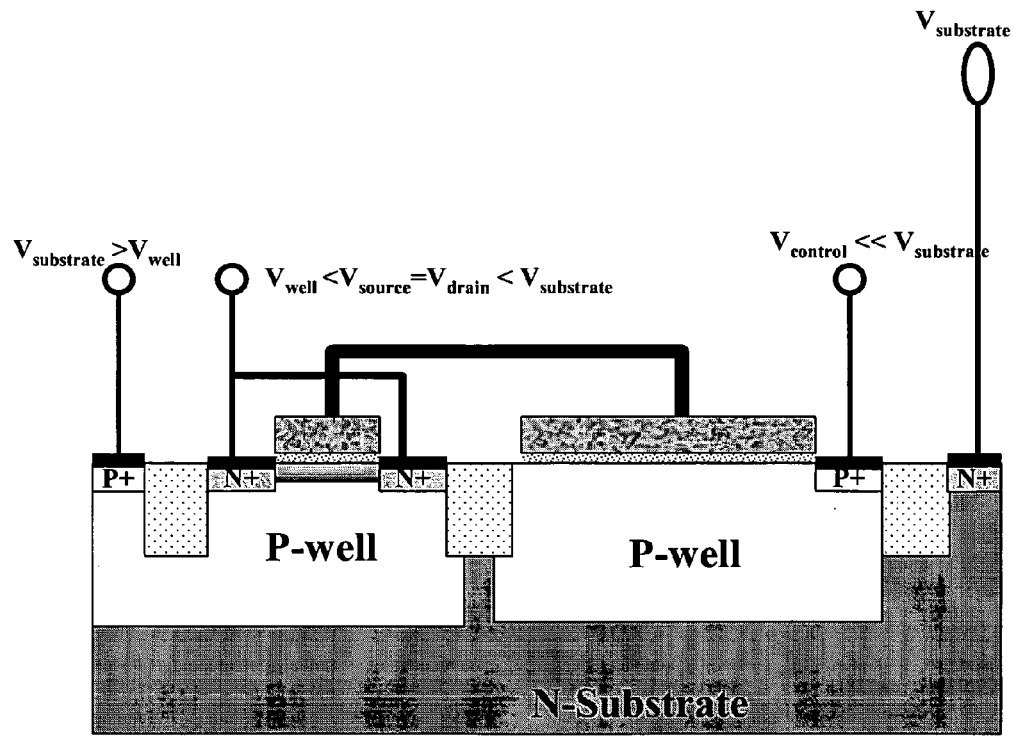
FIG. 10 shows an erase architecture of the fourth embodiment of FIG. 9.

FIG. 10 shows the erase architecture of the embodiment in FIG. 9. The control gate (capacitive Pwell) should be negative and much more negative than the substrate voltage to cause the F-T tunneling from floating gate to the transistor's source and drain. The source and drain voltage is slightly negative to regulate the F-N tunneling during process. To prevent the forward biasing from the transistor Pwell to source and drain (slight negative) during the erasing, the transistor Pwell should be equal or more negative relative to the source and drain. The F-N current regulation makes a highly homogeneous erase architecture.

The structure of FIG. 2 is fabricated on a p-type silicon wafer. The isolation structure 38 is formed with a standard isolation module fabrication process. After the basic isolation structure 38 is finished, the N-well 340 and the channel 326 of the NMOSFET 32 are formed by ion implantation. After the dielectrics of the two conducting gates 322 and 324 are grown, poly-Si deposition followed by the photolithography process is performed to form the single floating gate 40. Next, ion implantation is performed to form the source 324 and the drain 324' of the NMOSFET 32 and electrodes like the control gate. After metallization, the fabrication of many EEPROM memory cells is finished.

Using the same fabrication process, the memory cell in FIG. 5 is formed by ion implantation of the N-well and different patterning to the source-gate implanted region. Besides, the memory cell in FIGS. 7 and 9 is formed by using the same fabrication process on an n-type silicon wafer and different pattering to the well implanted region and source-gate implanted region. In the present invention, the above fabrication process means the common CMOS fabrication process.

In the present invention, when performing a program step, a nontrivial voltage is applied on the source of the single-gate MOSFET of the EEPROM memory cell. This nontrivial source voltage can produce a reverse voltage at the junction between the source and the substrate. The voltage drop between the source and the drain will allow channel carriers to move from the source to the drain. The reverse bias between the source and the substrate will further expand to the depleted junction region to produce a higher carrier density near the channel surface. The high carrier density near the channel surface will enhance the gate current effect to lower the total current required for program. Therefore, the reliability, program interference and program speed can be much improved. As compared to the technique of using no source voltage in the prior art, the improvement of the gate current efficiency can be as high as several hundred times.

Therefore, the program method of the present invention can greatly lower the current requirement of single-gate EEPROM. When erasing single-gate EEPROM, electric charges stored in the floating gate will be released to the substrate, and the voltages of the source and the drain of the MOSFET relative to the transistor substrate are raised to higher values to regulate the electric field distribution, hence lessening the problem of over erase. Besides, applying a back-bias to the semiconductor substrate can produce a wider depleted source-substrate junction to improve the efficiency of current flowing to the floating gate. This operation way can greatly lower the current requirement of performing a program step to single-gate EEPROM. Moreover, as for performing an erase step to single-gate EEPROM, the F-N tunneling current flows from the capacitor substrate via the floating gate to the transistor substrate. The voltages of the source and the drain of the MOSFET relative to the transistor substrate are raised to higher values to regulate the electric field distribution, hence lessening the problem of over erase.

Figure 3B:
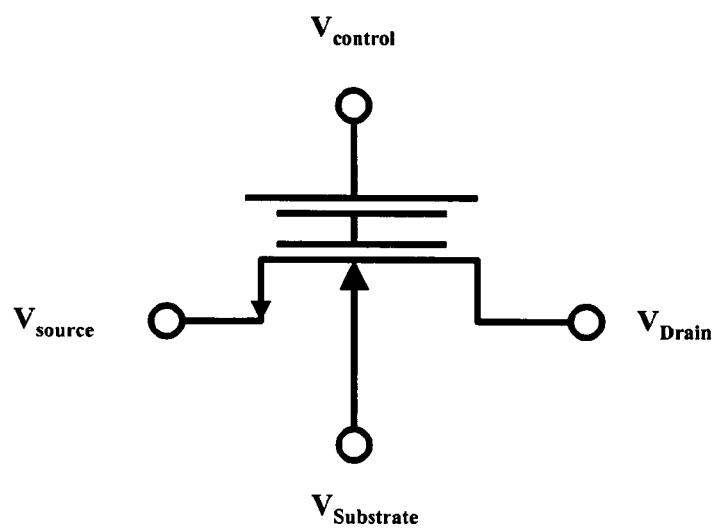
FIG. 3(b) shows an effective circuit of FIG. 3(a)
Figure 11:
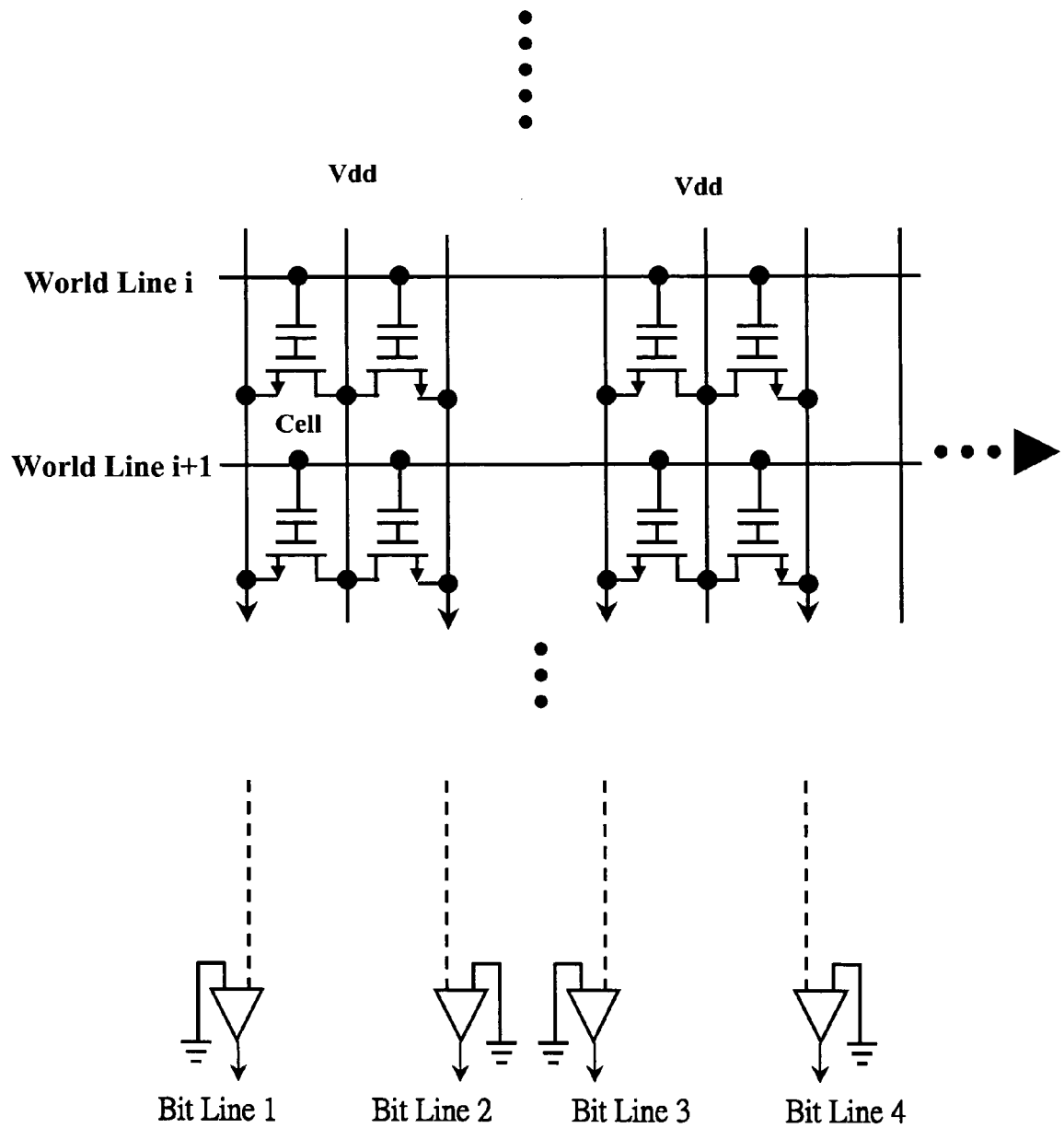
FIG. 11 is a diagram of a NOR flash EEPROM single-gate memory cell array of the present invention.

FIG. 11 is a diagram of a NOR flash EEPROM single-gate memory cell array of the present invention. The memory cell structure is shown in FIGS. 3(a) and 3(b). Each word line connects the control gates of memory cells in the same row. This is accomplished by connecting control gates of N-wells with metal wires to reduce the impedance of N-wells.

During the program step, a high positive voltage is applied to each selectable word line. Meanwhile, a voltage of Vdd and a positive voltage much smaller than Vdd are applied to a bit line cut off from the detection circuit to accomplish the ultra-low-current program for positive logic and negative logic, respectively.

When performing an erase step, a high voltage is applied to several word lines of the same block, and a slightly positive voltage is applied to the sources and the drains of transistors to accomplish program homogeneity.

When performing a read-out step, the memory cell array is cut off from a high voltage circuit. Readout of a row is accomplished by applying a voltage of Vdd to select a word line. Because a higher gate value is not used to turn on the cell transistor, other bit lines won't be charged when charging the bit line on the cell transistor.

To sum up, the present invention proposes an EEPROM that can be fabricated with a single floating gate and the common CMOS fabrication process. Conducting gates of a capacitor structure and a transistor are connected together to form the single floating gate with a small size. Through the program step of applying a nontrivial voltage on the source or a back-bias on the transistor substrate and the erase step of raising the source-drain voltage to regulate the F-N tunneling current, the effects of ultra-low program current and high-homogeneity erase can be accomplished, thereby greatly improving the reliability, program interference and program speed.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A nonvolatile memory structure comprising:
   a semiconductor substrate, said semiconductor substrate being p-type or n-type;
   a transistor located on a surface of said semiconductor substrate, said transistor comprising a first dielectric on the surface of said semiconductor substrate, a conducting gate stacked above said first dielectric, and several first doped regions in said semiconductor substrate as a source and a drain thereof, respectively; and
   a capacitor located on the surface of said semiconductor substrate and electrically separated from said transistor by an isolator region, said capacitor comprising a second doped well region formed in said semiconductor substrate, a single contact region formed in said well region, a second dielectric on a surface of said second doped well region, and a second conducting gate stacked above said second dielectric, wherein a control gate voltage $V_{control}$ is applied exclusively to said single contact region, and wherein said first and second conducting gates being are electrically connected together to form a single floating gate;
   wherein if said semiconductor substrate is p-type, then said first doped region and said second doped region are n-type, wherein during an erase mode of operation of said memory structure, a source voltage coupled to said source and a drain voltage coupled to said drain, respectively, are higher than a substrate voltage coupled to said semiconductor substrate, and wherein said control gate voltage is much higher than said substrate voltage.

2. A nonvolatile memory structure comprising:
   a semiconductor substrate, said semiconductor substrate being p-type or n-type;
   a transistor located on a surface of said semiconductor substrate, said transistor comprising a first dielectric on the surface of said semiconductor substrate, a conducting gate stacked above said first dielectric, and several first doped regions in said semiconductor substrate as a source and a drain thereof, respectively; and
   a capacitor located on the surface of said semiconductor substrate and electrically separated from said transistor by an isolator region, said capacitor comprising a second doped well region formed in said semiconductor substrate, a single contact region formed in said well region, a second dielectric on a surface of said second doped well region, and a second conducting gate stacked above said second dielectric, wherein a control gate voltage $V_{control}$ is applied exclusively to said single contact region, and wherein said first and second conducting gates are electrically connected together to form a single floating gate;
   wherein if said semiconductor substrate is n-type, then said first doped region and said second doped region are p-type, wherein during an erase mode of operation of said memory structure, a source voltage coupled to said source and a drain voltage coupled to said drain, respectively, are lower than a substrate voltage coupled to said semiconductor substrate, and wherein said control gate voltage is much smaller than said substrate voltage.

3. A nonvolatile memory structure comprising:
   a semiconductor substrate;
   a transistor located on a surface of said semiconductor substrate, said transistor comprising a first dielectric on the surface of said semiconductor substrate, a conducting gate stacked above said first dielectric, and several first doped regions in said semiconductor substrate as a source and a drain thereof, respectively;
   a capacitor located on the surface of said semiconductor substrate and electrically separated from said transistor by an isolator region, said capacitor comprising a second doped well region formed in said semiconductor substrate, a single contact region formed in said well region, a second dielectric on a surface of said second doped well region, and a second conducting gate stacked above said second dielectric, wherein a control gate voltage $V_{control}$ is applied exclusively to said single contact region, and wherein said first and second conducting gates are electrically connected together to form a single floating gate; and
   a third doped region is provided in said semiconductor substrate and below said first doped region, and wherein said third doped region is doped with impurities of the same type with said second doped region.

4. The nonvolatile memory structure as claimed in claim 3, wherein if said semiconductor substrate is n-type, then said second and third doped regions are p-type.

5. The nonvolatile memory structure as claimed in claim 3, wherein if said semiconductor substrate is p-type, then said second and third doped regions are n-type.

6. A method of operating a nonvolatile memory, said nonvolatile memory comprising several first doped regions as a source and a drain and a first conducting gate, and a capacitor structure composed of a second doped region and a second conducting gate on a p-type semiconductor substrate, said first and second conducting gates being connected together to form a single floating gate, a substrate voltage, a source voltage, a drain voltage, and a control gate voltage being applied on said substrate, said source, said drain and said second doped region, respectively, said method comprising:

performing a program step to let said substrate voltage be grounded or nonzero but close to zero and let said source voltage and said drain voltage be higher than said substrate voltage but much smaller than said control gate voltage; and performing an erase step to let said source voltage and said drain voltage be higher than said substrate voltage but much smaller than said control gate voltage.

7. A method of operating a nonvolatile memory, said nonvolatile memory comprising an N-well, several first doped regions as a source and a drain and a first conducting gate, and a capacitor structure composed of a second doped region and a second conducting gate on a p-type semiconductor substrate, said first and second conducting gates being connected together to form a single floating gate, a well voltage, a substrate voltage, a source voltage, a drain voltage, and a control gate voltage being applied on said N-well, said substrate, said source, said drain and said second doped region, respectively, said method comprising:

performing a program step to let said substrate voltage be wounded or nonzero but close to zero and let said well voltage and said drain voltage be higher than said source voltage and let said source voltage be higher than said control gate voltage and let said control gate voltage be higher than said substrate voltage; and performing an erase step to let said well voltage be much larger than said substrate voltage and said control gate voltage be much larger than said well voltage and let said source voltage and said drain voltage be smaller than said substrate voltage.

8. A method of operating a nonvolatile memory, said nonvolatile memory comprising several first doped regions as a source and a drain and a first conducting gate and a capacitor structure composed of a second doped region and a second conducting gate on an n-type semiconductor substrate, said first and second conducting gates being connected together to form a single floating gate, a substrate voltage, a source voltage, a drain voltage, and a control gate voltage being applied on said substrate, said source, said drain and said second doped region, respectively, said method comprising:

performing a program step to let said substrate voltage be grounded or nonzero but close to zero and let said source voltage and said drain voltage be lower than said substrate voltage but much higher than said control gate voltage; and performing an erase step to let control gate voltage be smaller than said substrate voltage and let said source voltage and said drain voltage be negative but have much smaller magnitudes than that of said control gate voltage.

9. A method of operating a nonvolatile memory, said nonvolatile memory comprising a P-well, several first doped regions as a source and a drain and a first conducting gate and a capacitor structure composed of a second doped region and a second conducting gate on an n-type semiconductor substrate, said first and second conducting gates being connected together to form a single floating gate, a well voltage, a substrate voltage, a source voltage, a drain voltage, and a control gate voltage being applied on said P-well, said substrate, said source, said drain and said second doped region, respectively, said method comprising:

performing a program step to let said substrate voltage be grounded or nonzero but close to zero and let said source voltage be higher than said well voltage and let said drain voltage be higher than said source voltage and let said control gate voltage be higher than said source voltage but smaller than said substrate voltage; and performing an erase step to let said well voltage be much smaller than said substrate voltage and let said control gate voltage be much smaller than said well voltage and let said source voltage and said drain voltage be higher than said substrate voltage.

* * * * *